United States Patent

Takenaka

[11] Patent Number: 5,699,289
[45] Date of Patent: Dec. 16, 1997

[54] POWER SOURCE CIRCUIT AND WIRING GROUP FOR SEMICONDUCTOR MEMORY DEVICE

[75] Inventor: Hiroyuki Takenaka, Kanagawa-ken, Japan

[73] Assignee: Yamaha Corporation, Hamamatsu, Japan

[21] Appl. No.: 586,947

[22] Filed: Jan. 16, 1996

[30] Foreign Application Priority Data

Jan. 17, 1995 [JP] Japan .................. 7-004551

[51] Int. Cl.$^6$ .................. G11C 5/02; G11C 5/06; G11C 8/00
[52] U.S. Cl. .................. 365/51; 365/63; 365/226; 365/230.03; 365/230.06
[58] Field of Search .................. 365/51, 63, 226, 365/230.03, 230.06

[56] References Cited

U.S. PATENT DOCUMENTS

| | | | |
|---|---|---|---|
| 5,040,144 | 8/1991 | Pelley et al. | 365/51 |
| 5,208,782 | 5/1993 | Sakuta et al. | 365/51 |
| 5,231,607 | 7/1993 | Yoshida et al. | 365/226 |
| 5,293,559 | 3/1994 | Kim et al. | 365/51 |
| 5,321,646 | 6/1994 | Tomishima et al. | 365/51 |
| 5,325,336 | 6/1994 | Tomishima et al. | 365/51 |
| 5,375,095 | 12/1994 | Yamada et al. | 365/226 |
| 5,390,140 | 2/1995 | Tomishima et al. | 365/51 |
| 5,426,615 | 6/1995 | Tomishima et al. | 365/226 |
| 5,535,152 | 7/1996 | Han et al. | 365/51 |

Primary Examiner—David C. Nelms
Assistant Examiner—Trong Quang Phan
Attorney, Agent, or Firm—Loeb & Loeb LLP

[57] ABSTRACT

A semiconductor memory including at least one core block, each core block having sense amplifier arrays arranged alternately with memory cell arrays and sense amplifier drive circuits arranged at an end of the sense amplifier arrays. Additionally, a power source circuit is arranged in an L-shape along a long side and a short side of each core block. A power source wiring group is arranged in a mesh-like form above each core block for connecting the power source circuit to the sense amplifier drive circuits. As a result, sufficient power can be supplied to the circuits within the core block that require power, such as the sense amplifier drive circuits, without increasing chip area.

30 Claims, 21 Drawing Sheets

POWER SOURCE CIRCUIT AND WIRING GROUP FOR SEMICONDUCTOR MEMORY DEVICE

FIELD OF THE INVENTION

The present invention relates to a semiconductor memory, and more specifically to a power source circuit, for supplying power to a sense amplifier drive circuit, and a wiring group connected to the power source circuit.

BACKGROUND OF THE INVENTION

Conventionally, a semiconductor random access memory (hereinafter, RAM) powers various peripheral circuits through the use of an internal power source voltage, which is produced by lowering an external power source voltage. This is done because the operational voltage in semiconductor chips has been lowered by the miniaturization of the semiconductor elements. Furthermore, there is a necessity for using an internal power source voltage instead of an external power source voltage. In such an internal power source circuit, the voltage drop transistor is apt to be large because it must drive a large current. More specifically, it is necessary to set W/L (channel width of transistor/channel length of transistor), which corresponds to current driving ability, to a large value. Therefore, the width, i.e., W needs to be magnified. Because the conventional voltage drop transistor must occupy a comparatively large region on the chip, its arrangement has been a problem Additionally, the conventional arrangement of the power source wirings causes various problems in the design of a RAM. Because a comparatively large current temporarily flows in the conventional power source wirings, it is necessary to use wirings that have a large capacity so thick metal wirings are typically used. Further, in a RAM, the sense amplifier drive circuits consume a comparatively large amount of power during operation. Because such sense amplifier drive circuits are usually arranged at opposite ends of the memory cell arrays or core blocks, it is usually necessary to arrange thick metal wirings detouring around the memory cells. This causes an increase in chip area. Although a technology in which a plurality of power source wirings are arranged in parallel on memory cell arrays to solve such a problem is disclosed in detail in U.S. Pat. No. 5,231,607, that technology still has drawbacks because it requires thick wiring groups from a power source circuit to the memory cells.

Thus, there are problems in a conventional semiconductor memory in which power source wirings occupy a large area. There is a need for reducing chip area.

SUMMARY OF THE INVENTION

In view of these problems, it is the object of the present invention to remove the above-mentioned drawbacks and to provide a semiconductor memory having a power source circuit and power source wirings capable of supplying sufficient power without increasing chip area.

According to the present invention, the power source wiring groups, which are arranged above the core blocks in a mesh-like form connecting the power source circuit to the plurality of sense amplifier drive circuits, constitute a planar wiring that can supply sufficient power to the circuits beneath the planar wirings. Further, even if a disconnection is caused at a wiring or contact in a portion of the planar wiring, the power supply can use other wiring paths to detour around the defective portions. This contributes to a promotion in yield. Additionally, the planar wiring is arranged immediately above the core block and power is supplied by the power source circuit from both a long side and a short side of the core block. Thus, wirings from power source circuit to the planar wiring are not necessary. Accordingly, chip area is reduced.

DETAILED DESCRIPTION OF THE PREFERRED EMBODIMENTS

The embodiments of the present invention will be described in detail hereinbelow with reference to the attached drawings. Although the present invention can naturally be used in various semiconductor memories (SRAM, EPROM, MROM, etc.), the description will be given for a DRAM because the present invention has a structure preferable to a DRAM as will be explained.

Figure 1:
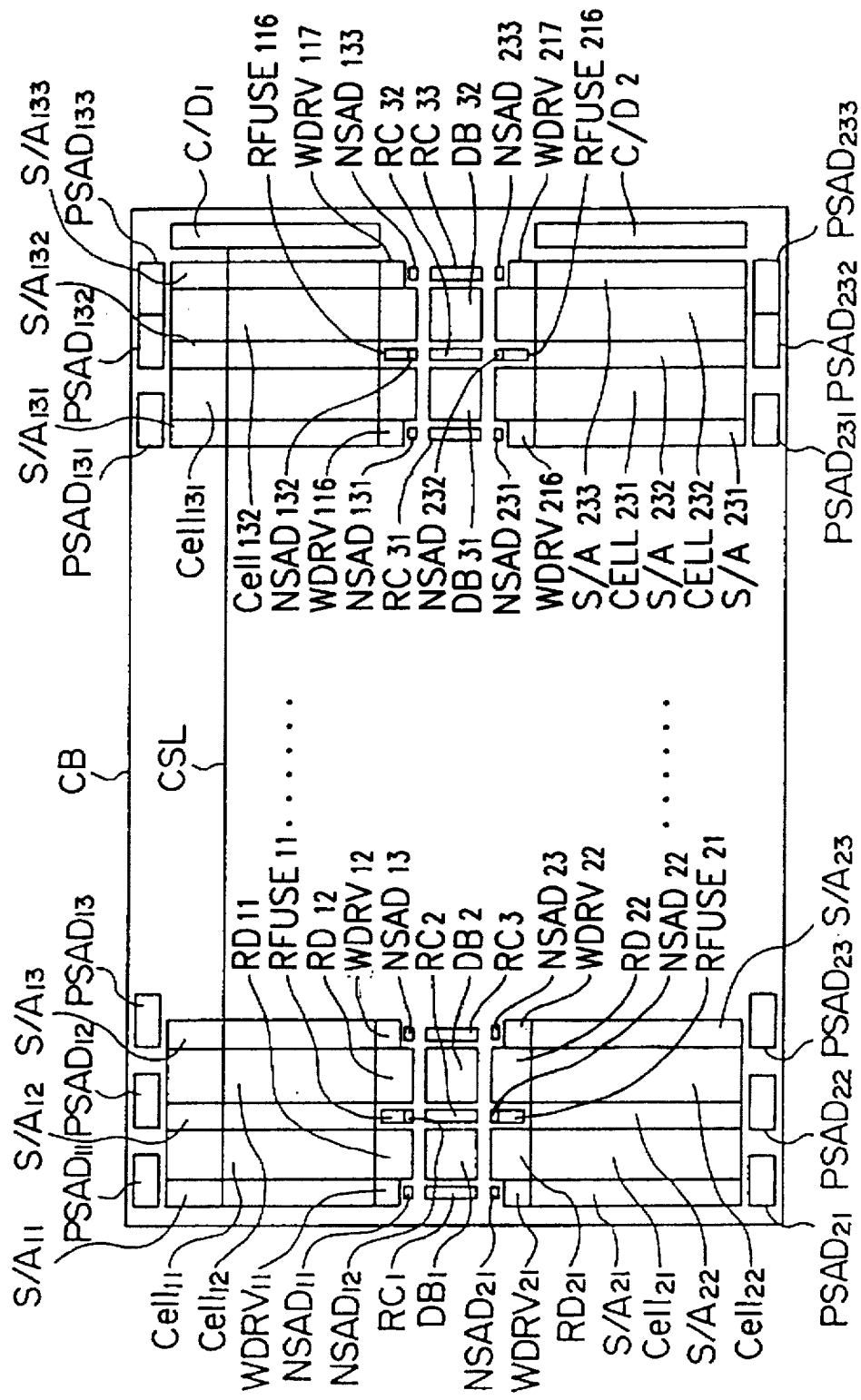
FIG. 1 is a plane view of a semiconductor memory showing essential portions of an embodiment of the present invention.

FIG. 1 is a plane view illustrating only a core block CB, which is an essential part of a DRAM of the present invention. Illustratively, the core block has a memory capacity of 16M bits. Thirty-two of sixty-four memory cell arrays (Cell 11 through Cell 132), each having a capacity of 256K bits, are arranged at the top half of the core block. The other thirty-two memory cell arrays (Cell 21 through Cell 232) are arranged at the bottom half of the core block. Sixty-six sense amplifier rows (S/A 11 through S/A 133 and S/A 21 through S/A 233) are alternately arranged with the memory cell arrays (Cell 11 through Cell 132 and Cell 21 through Cell 232). A P-channel sense amplifier drive circuit (PSAD 11 through PSAD 133 and PSAD 21 through PSAD 233) corresponds to each of the sense amplifier rows and drives P-channel sense amplifiers in its corresponding sense amplifier row. Similarly, an N-channel sense amplifier drive circuit (NSAD 11 through NSAD 133 and NSAD 21 through NSAD 233) corresponds to each of the sense amplifier rows and drives N-channel sense amplifiers in its corresponding sense amplifier row. A row decode circuit (RD 11 through RD 132 and RD 21 through RD 232) is arranged at one end of each of the memory cell arrays (toward the center of the core block). Each row decode circuit drives a word line in the adjacent memory cell array, Cell. Additionally, word line drive signal generating circuits (WDRV 11 through WDRV 117 and WDRV 21 through WDRV 217) and redundancy fuses (RFUSE 11 through RFUSE 116 and RFUSE 21 through RFUSE 216) are arranged among the row decode circuits RD. Row control circuits (RC 1 through RC 33) and intermediate input/output buffers (DB 1 through DB 32) are arranged between the top half and the bottom half of the memory cell arrays, Cell. Column select lines CSL, which are connected to the column decode circuits (C/D 1 and C/D 2), arranged at the right end of the core block CB, drive column gate transistors and the like in the sense amplifier circuits to select one column or several columns of bit lines.

In the core block CB, data read from dynamic-type memory cells in a memory cell array Cell is amplified by sense amplifiers in a sense amplifier column S/A, transmitted to the central portion of the core block CB via DQ lines (not shown) in the sense amplifier column S/A, again amplified by an intermediate input/output buffer DB, and transmitted outside the core block CB via an RWD line (not shown) that transverses the central portion of the core block from left to right.

During normal operation of the core block shown in FIG. 1, the sense amplifier drive circuits PSAD and NSAD consume the most power. Each sense amplifier drive circuit must charge (or discharge) the drive lines commonly connected to a plurality of sense amplifier circuits in a sense amplifier column. This charging and discharging of the drive lines corresponds to the charging and discharging of bit lines via transistors in the sense amplifiers. Accordingly, the sense amplifier drive circuits require a substantial amount of power to supply current for the charging and discharging of the bit lines during operation. Therefore, the P-channel sense amplifier drive circuits PSAD require a power source potential VDD to be supplied by wirings having a large capacity and the N-channel sense amplifier drive circuits NSAD require a ground potential Vss to be supplied by wirings having a large capacity.

Figure 2:
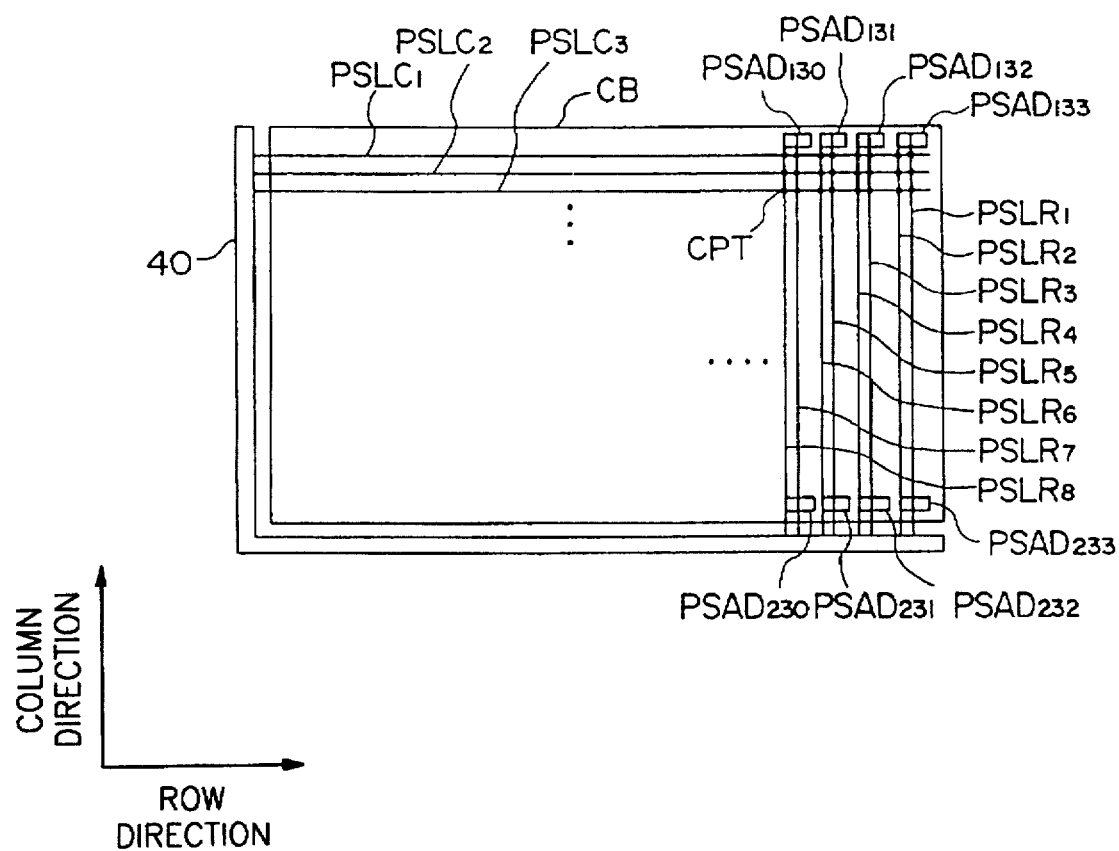
FIG. 2 is a plane view of a semiconductor memory showing in more detail essential portions of an embodiment of the present invention.

FIG. 2 shows a power source circuit and a power source wiring structure for supplying power source potential or the like to the sense amplifier drive circuits PSAD and NSAD in a core block CB. Here, a power source wiring structure for supplying VDD (the internal power source potential) is shown. A power source circuit 40 is arranged in an L-shape that runs along a long side and a short side of the core block CB. A plurality of column direction power source wirings PSLR are connected to the long side of the power source circuit 40 and are arranged in parallel with the column direction. Additionally, a plurality of row direction power source wirings PSLC are connected to the short side of the power source circuit 40 and are arranged in the row direction. The column direction power source wirings PSLR and the row direction power source wirings PSLC are connected to each other at intersections CPT and to the P-channel sense amplifier drive circuits PSAD.

Figure 3:
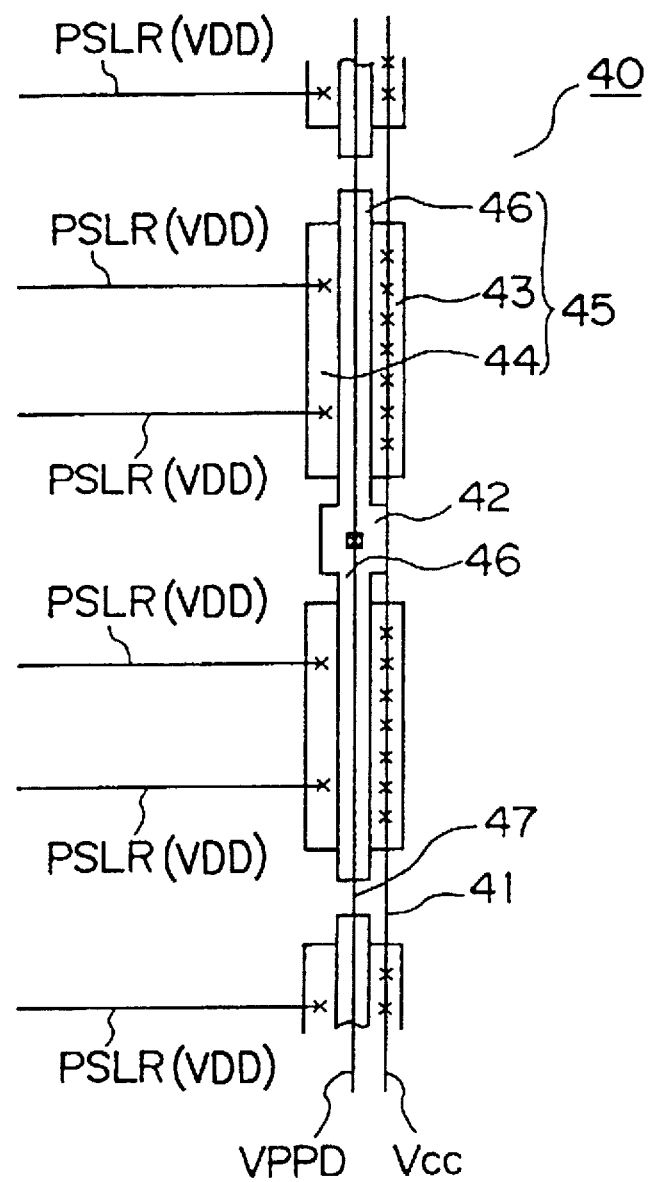
FIG. 3 is a plane view showing the essential portions of an embodiment of the present invention in more detail by magnifying them.

FIG. 3 shows a magnified plane view of the power source circuit 40 shown in FIG. 2. The power source circuit 40 is composed of a plurality of N-channel MOS transistor rows. Each N-channel MOS transistor has a drain 43, a source 44, and a gate 46 that combine to form an SDG region 45. An external power source potential Vcc is supplied to the drain 43 by a Vcc wiring 41. The source 44 is adjacent to the core block CB and is connected to either the column direction power source wirings PSLR or the row direction power source wirings PSLC (the PSLR connection being shown in FIG. 3). The gate 46 is connected to a VPPD 47 wiring at a contact region 42. The VPPD wiring supplies a reference potential to the N-channel MOS transistor. This N-channel MOS transistor corresponds to an N-channel MOS transistor Q66 at an output stage of the power source circuit, shown in FIG. 10.

Figure 4:
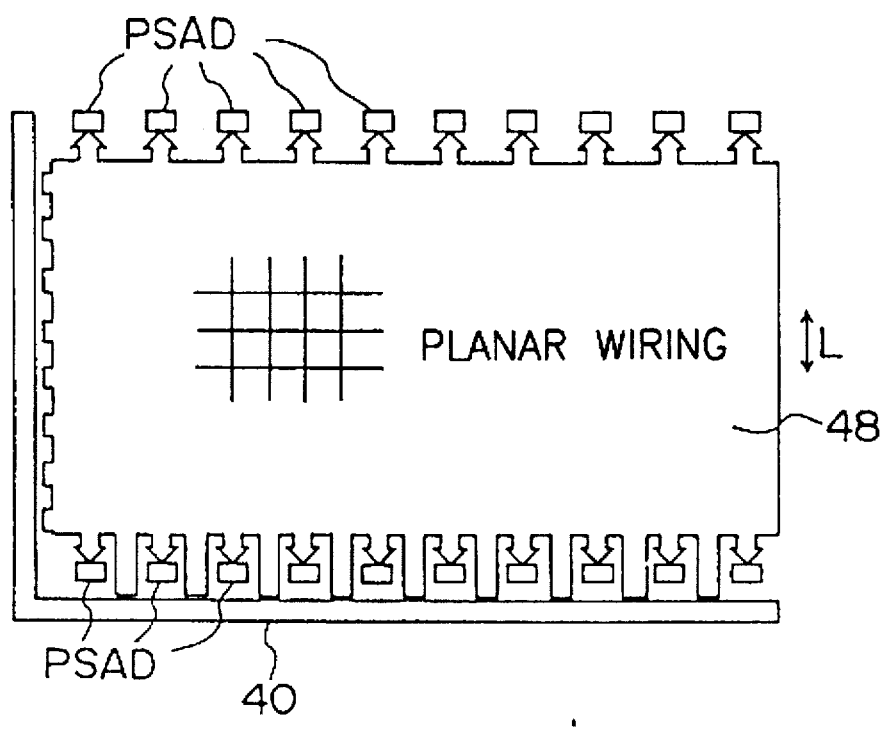
FIG. 4 is a plane view outlining the operation and effect of the present invention.

FIG. 4 illustrates the operation of the power source circuit and the power source wiring structure of FIG. 2. A planar wiring 48 is formed by the plurality of column direction power source wirings PSLR, which are arranged longitudinally in the row direction, and the plurality of row direction power source wirings PSLC, which are arranged transversely in the column direction. This power source wiring group is arranged above the core block CB in a mesh-like form and connects the power source circuit 40 to the plurality of sense amplifier drive circuits PSAD. In this way, the power source wiring group can supply sufficient power to the circuits beneath the planar wirings. Further, even if a disconnection is caused at a wiring or contact in a portion of the planar wiring, the power supply can use other intact wiring paths to detour the defective portions. This contributes to a promotion in yield. Additionally, the planar wiring 48 is arranged immediately above the core block and power is supplied by the power source circuit from both a long side and a short side of the core block. Thus, wirings from the power source circuit to the planar wiring are not necessary so chip area is reduced.

Figure 5:
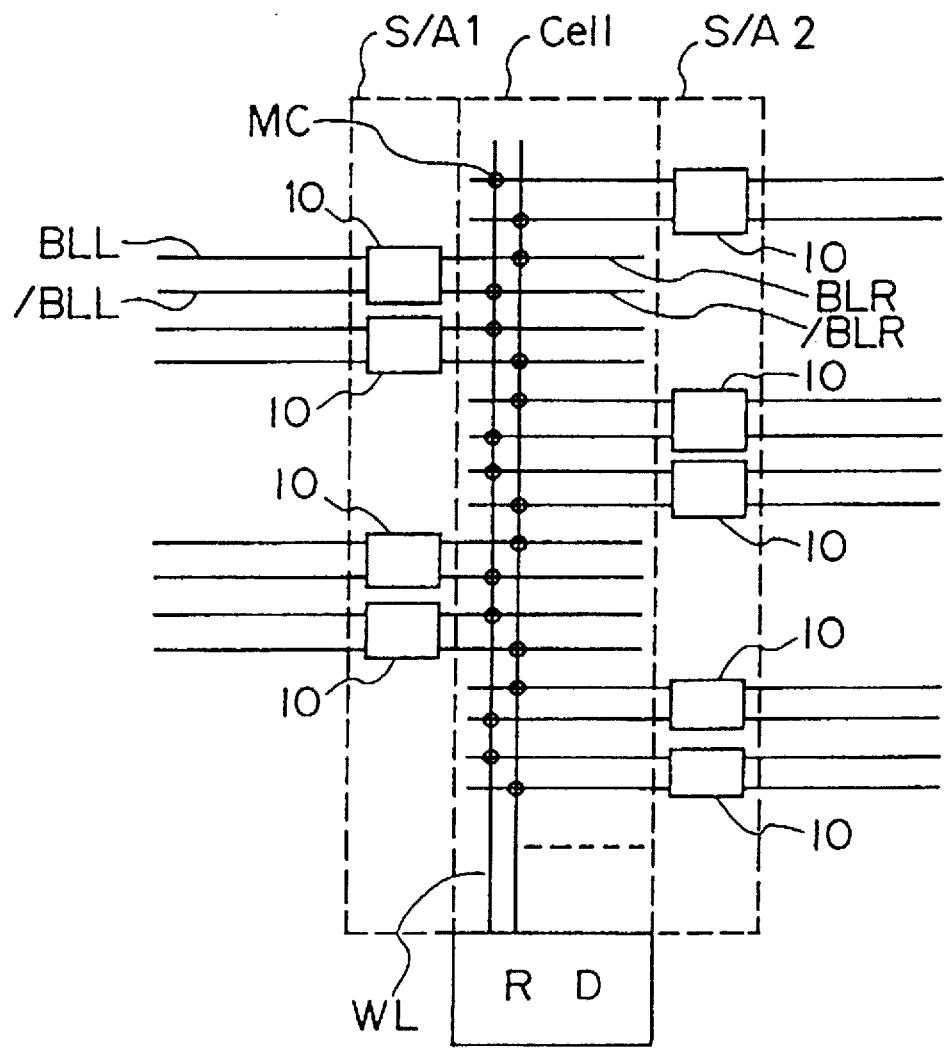
FIG. 5 is a plane view showing the essential portions of an embodiment of the present invention in more detail by magnifying them.

FIG. 5 shows the structure of a memory cell array Cell and its two adjoining sense amplifier arrays (S/A 1 and S/A 2). The memory cell array is of the shared sense amplifier structure in which two pairs of bit lines (for example BLL and /BLL, and BLR and /BLR) are connected to each of the sense amplifier circuits 10. Every two sense amplifiers in a sense amplifier array are grouped together and connected to adjacent pairs of bit lines in the memory cell array Cell. These sense amplifier groups are arranged in a staggered arrangement, as shown in FIG. 5. Specifically, the locations of the sense amplifiers in view from the pairs of bit lines are on the right, right, left, left, right, right, left, left and so on. Each bit line is connected to a dynamic-type memory cell MC composed of a transistor and a capacitor. Memory cells belonging to the same column are connected to the same pair of bit lines and memory cells belonging to the same row are connected to the same word line WL. The word lines are selectively driven by the row decode circuits R/D as previously explained. A row decode circuit includes at least a word line driving circuit for charging the word lines to the "H" level by P-channel transistors. The drive signal supply circuits WDRV are used as their drive sources and the Vpp generating circuits (Vpp Pump 1 and Vpp Pump2), which generate a boosted voltage Vpp, are used as their power sources.

Figure 6:
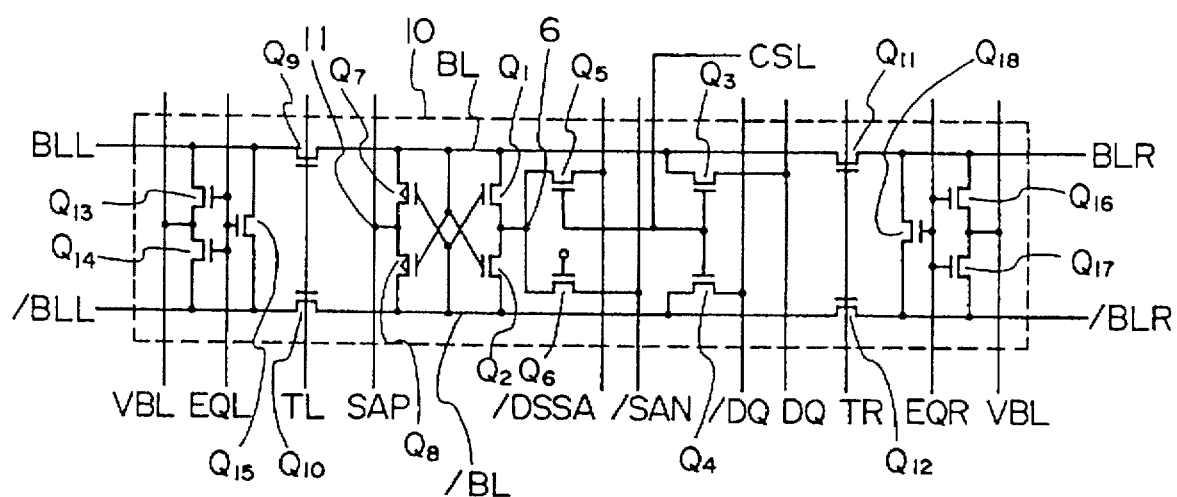
FIG. 6 is a circuit diagram showing the essential portions of an embodiment of the present invention in more detail by magnifying them.

FIG. 6 shows in more detail a sense amplifier circuit 10 from FIG. 5. A left side pair of bit lines (BLL and /BLL) is coupled to a pair of bit lines (BL and /BL) via the N-channel MOS transistors Q9 and Q10 when driven by a signal line TL. Similarly, a right side pair of bit lines (BLR and /BLR) is coupled to the pair of bit lines (BL and /BL) via the N-channel MOS transistors Q11 and Q12 when driven by another signal line TR. An N-channel sense amplifier, composed of N-channel MOS transistors Q1 and Q2, and a P-channel sense amplifier, composed of P-channel MOS transistors Q7 and Q8, are connected to the pair of bit lines (BL and /BL). The drive terminal 6 of the N-channel sense amplifier is coupled to /DSSA through a MOS transistor Q5 driven by the column select line CSL and to /SAN through a MOS transistor Q6, which functions as a resistor element because its gate is connected to Vcc. The drive terminal 11 of the P-channel sense amplifier is connected to a P-channel sense amplifier drive line SAP, which is driven by the above-mentioned P-channel sense amplifier drive circuit PSAD. Further, the bit lines (BL and /BL) are respectively coupled to data lines (DQ and /DQ) via MOS transistors Q3 and Q4 when driven by the column select line CSL. A very small potential difference between the data lines (DQ and /DQ) will be amplified to a logic level signal by the above-mentioned data line amplifying circuits DB. An equalizing circuit, composed of MOS transistors Q13, Q14 and Q15, equalizes the left plane pair of bit lines BLL and /BLL to approximately ½ Vcc when driven by a signal EQL (½ Vcc is supplied by line VBL). Similarly, another equalizing circuit, composed of MOS transistors Q16, Q17 and Q18, equalizes the right plane pair of bit lines BLR and /BLR to approximately ½ Vcc when driven by a signal EQR.

An explanation will now be given of the operation of the sense amplifier circuit 10 shown in FIGS. 5 and 6. For this explanation, it will be assumed that the selected memory cell MC is coupled to the left side pair of bit lines (BLL and /BLL). The signal line TL becomes "H" level so the MOS transistors Q9 and Q10 become conductive and the left side pair of bit lines (BLL and /BLL) is coupled to the pair of bit lines (BL and /BL). The signal line TR becomes "L" level so the MOS transistors Q11 and Q12 become nonconductive and the right side pair of bit lines (BLR and /BLR) is disconnected from the pair of bit lines (BL and /BL). The signal EQL changes from "H" level to "L" level so the equalizing operation is terminated. Successively, when the word line WL is activated, the dynamic-type memory cell MC is selected and a very small potential difference is caused between the pair of bit lines (BL and /BL).

Next, the potentials of the first and second N-channel sense amplifier drive lines /SAN and /DSSA change from ½ Vcc (which is approximately half of the internal power source voltage) to Vss (ground potential). Then, the very small potential difference between the pair of bit lines is amplified by the MOS transistors Q1 and Q2 and the potential of either BL or /BL is drawn more to the side of Vss. In a selected column, the column select line CSL is changed to "H" level so the MOS transistor Q5 becomes conductive and the sense amplifier 10 connected to that CSL is activated at a higher speed than sense amplifiers in columns that are not selected (where CSL is "L" level). Similarly, in the parallel P-channel sense amplifier, the potential of the P-channel sense amplifier drive line SAP is raised from ½ Vcc to Vcc. Then, the very small potential difference between the pair of bit lines is amplified by the MOS transistors Q7 and Q8 and the potential of either BL or /BL is dram more to the side of Vcc. As a result, after a predetermined time period has elapsed, the potentials of both the left side pair of bit lines and the pair of bit lines (BL and /BL) are amplified to the logic level signal of Vcc/Vss. Finally, this amplified potential difference is transferred from the pair of bit lines to the pair of data lines (DQ and /DQ) via the column select transistors Q3 and Q4, is converted into a logic level signal by a data line amplifying circuit DB, and is read outside the chip as output data.

While both of the N-channel sense amplifier drive lines (/SAN and /DSSA) are simultaneously but independently driven, the parasitic capacitance of /SAN is comparatively large because it must simultaneously activate the sense amplifiers of one row, while the parasitic capacitance of /DSSA is comparatively small because it activates only the sense amplifier selected by the column select line CSL. Although a sense amplifier drive line selecting circuit (discussed later) drives the first and second sense amplifier drive lines independently, /DSSA is not influenced by the comparatively large capacitance of /SAN. This is because the MOS transistor Q6, which acts as a resistor element, is connected between /SAN and the drive terminal 6 at each sense amplifier 10. Thus, it is possible to drive the N-channel sense amplifier drive line /DSSA at high speed.

An explanation of the case where the selected memory cell MC is coupled to the right side pair of bit lines (BLR and /BLR) will be omitted because it is analogous to the above-explained case where the selected memory cell is coupled to the left side pair of bit lines (BLL and /BLL).

Figure 7:
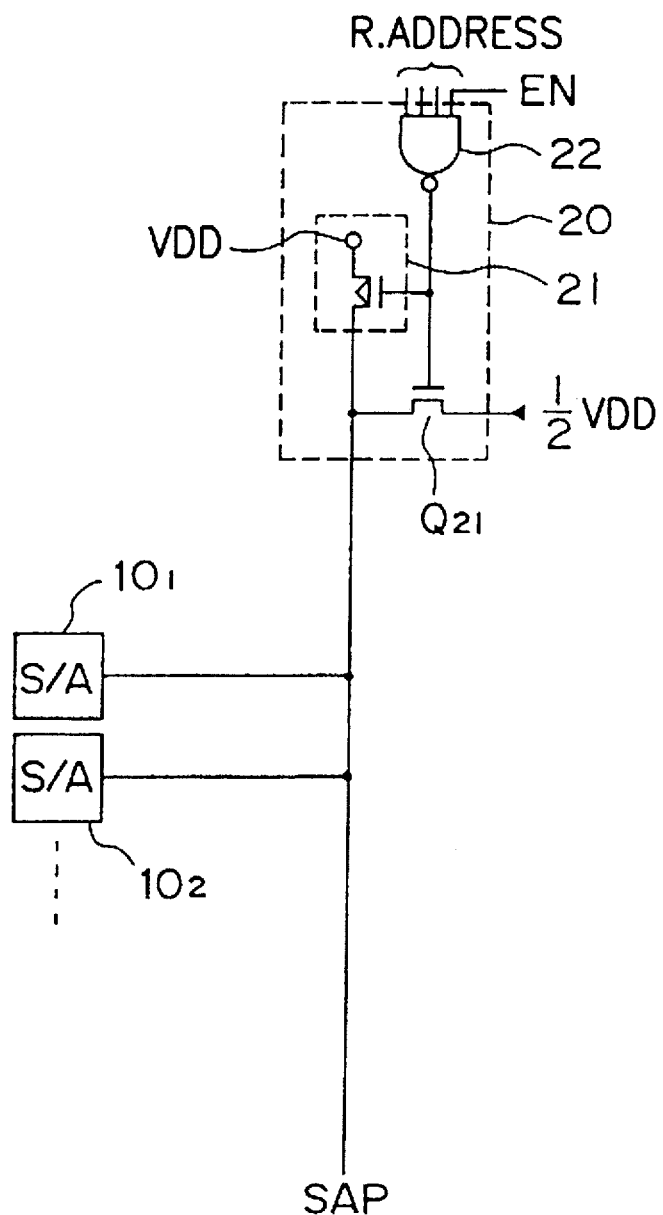
FIG. 7 is a circuit diagram showing in detail other essential portions of an embodiment of the present invention.

FIG. 7 shows in detail a P-channel sense amplifier drive circuit PSAD. In the P-channel sense amplifier, the sense operation is performed by supplying VDD (the internal power source potential) to the drive terminal 11 (FIG. 6) of the P-channel sense amplifier via the P-channel sense amplifier drive line SAP. A drive control circuit 20 of the P-channel sense amplifier drive circuit PSAD is composed of a drive circuit 21, an N-channel MOS transistor Q21 that equalizes the drive line, and a decoder circuit 22 that generates a select signal based on a row address (R.Address). The drive circuit 21, which is composed of a P-channel MOS transistor whose source is connected to the internal power source VDD, performs the charging of the bit lines. This drive circuit 21 is connected to the above-mentioned planar wiring.

Figure 8:
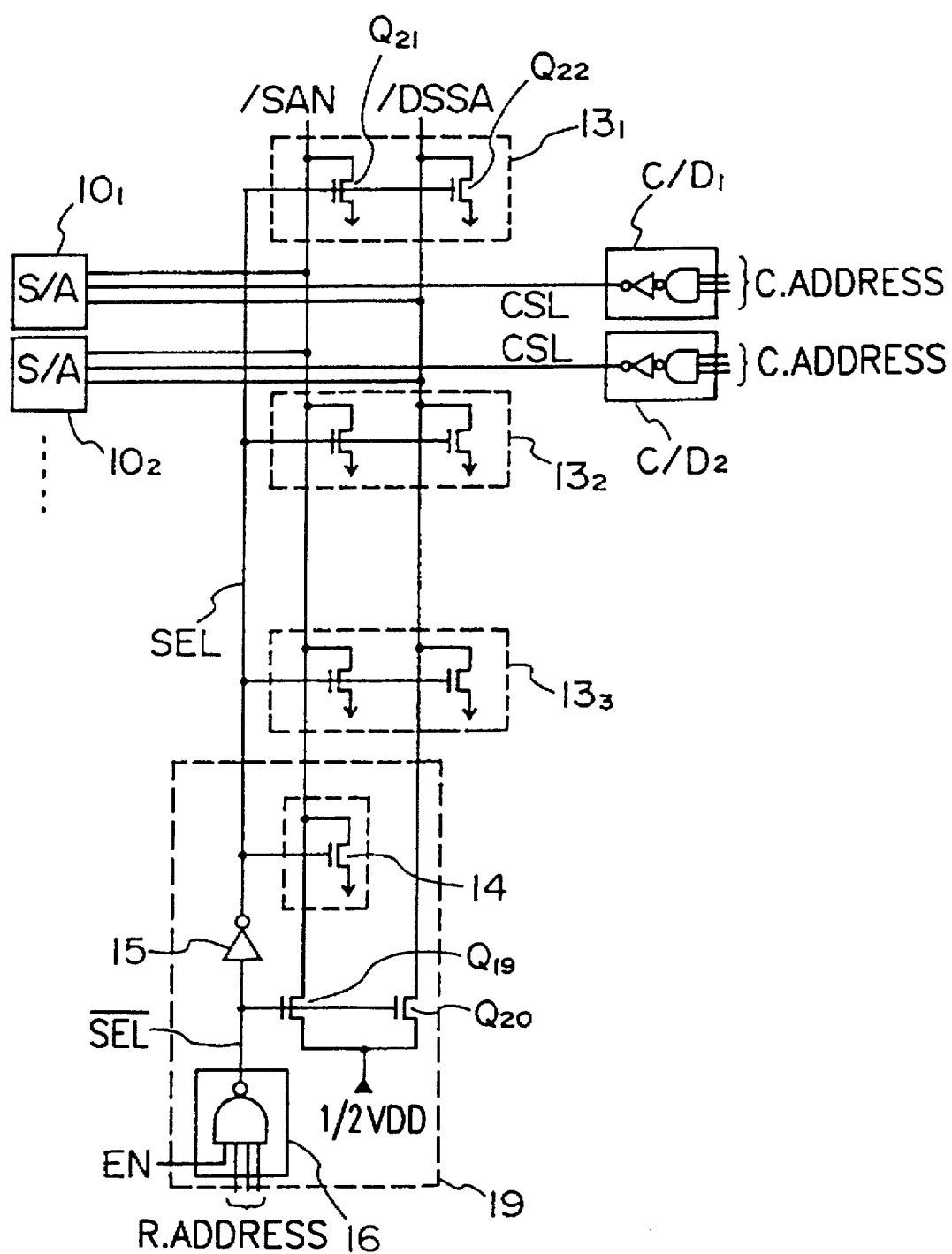
FIG. 8 is a circuit diagram showing in detail still other essential portions of an embodiment of the present invention.

FIG. 8 shows in detail an N-channel sense amplifier drive circuit NSAD. The drive function of a drive transistor must be as high as possible to drive a sense amplifier at high speed. To realize this necessity on a chip, a wide channel region is required (as previously explained). In this embodiment of the present invention, drive transistors are disperseally arranged. A drive circuit 13 is divided into a plurality of portions each including a pair of N-channel MOS transistors for driving the N-channel sense amplifier drive lines (/SAN and /DSSA) to the ground level. The gate of each of these N-channel MOS transistors is driven by the same control signal line SEL. The column decoder circuits C/D drive the column select lines CSL based on the column address signal (C.Address).

The N-channel sense amplifier drive circuit NSAD further includes a drive control circuit 19 for controlling the drive circuits 13. Each of the sense amplifier drive lines (/SAN and /DSSA) is coupled to a terminal having a level of ½ VDD through a MOS transistor (Q19 and Q20, respectively). To form the control signal SEL, a decoder circuit 16 generates a select signal based on the row address (R.Address) and then this select signal is inverted by an inverter circuit 15. The MOS transistors Q19 and Q20 are driven by the select signal (/SEL) generated by the decoder circuit 16. An auxiliary transistor 14 is shown as an auxiliary means for driving /SAN to enhance capacity further. In this embodiment, the dispersedly-arranged drive transistors achieve an effect similar to that of a MOS transistor having a substantially high drive capacity. As a result, a high-speed sense amplifier drive line can be driven with only a small increase in chip area.

The ground potential is supplied to the drive transistors (13 and 14) of the N-channel sense amplifier drive circuit NSAD (shown in FIG. 8) by a ground wiring group. This ground wiring group is longitudinally and transversely arranged to form a planar wiring substantially the same as the power source planar wiring. A method of arranging two kinds of wiring groups (ground and power source) in the same wiring layer will be described later.

By using the sense amplifier drive circuits of FIGS. 7 and 8 and by adopting the wiring structure of FIGS. 2 and 3, "partial deviation of potential" (partial drop in the power source potential and partial rise in the ground potential) can be avoided as much as possible. This results in both the prevention of erroneous operation and an acceleration in operating speed.

Figure 9:
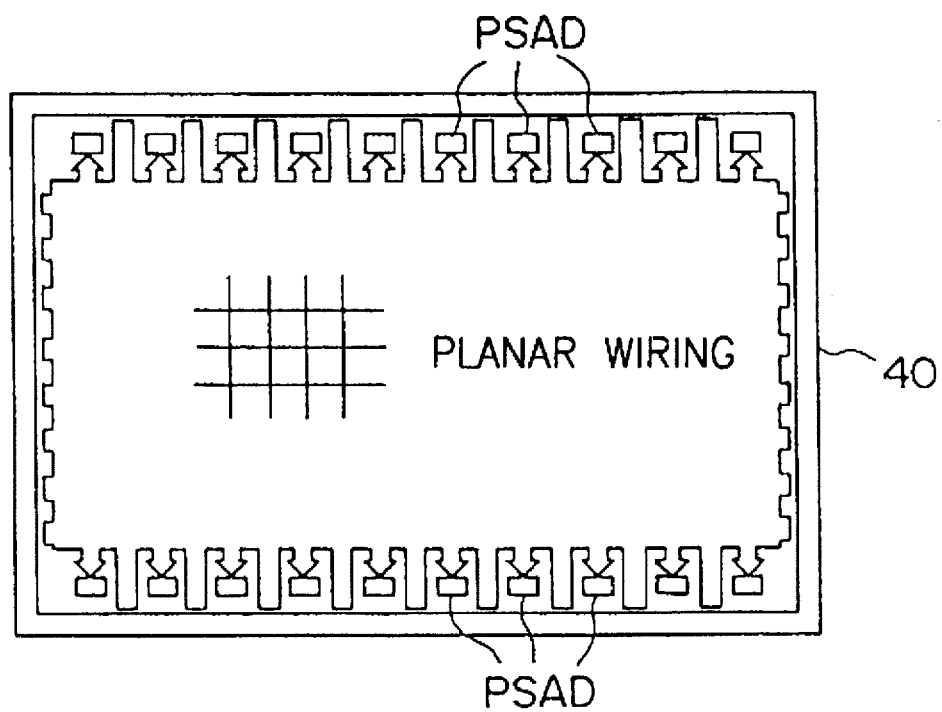
FIG. 9 is a plane view explaining another embodiment of the present invention and outlining its operation and effect.

FIG. 9 shows another embodiment of the present invention. In this embodiment, edges of a planar wiring or a core block are surrounded by a power source circuit 40. As a result, the P-channel sense amplifiers on both the top half and the bottom half of the core block are proximate to the power source circuit 40. This further contributes to an acceleration in operating speed and the prevention of erroneous operation. However, in the first embodiment as shown in FIG. 4, wirings for the external transfer of data (an RWD line) are much more simplified because the power source circuit 40 is "L-shaped" so it is present at only half of the border of the core block. The embodiment shown in FIG. 4 contributes to a greater reduction in chip area.

A power source system for a DRAM of the present invention will now be discussed with reference to FIGS. 10 through 15.

Figure 10:
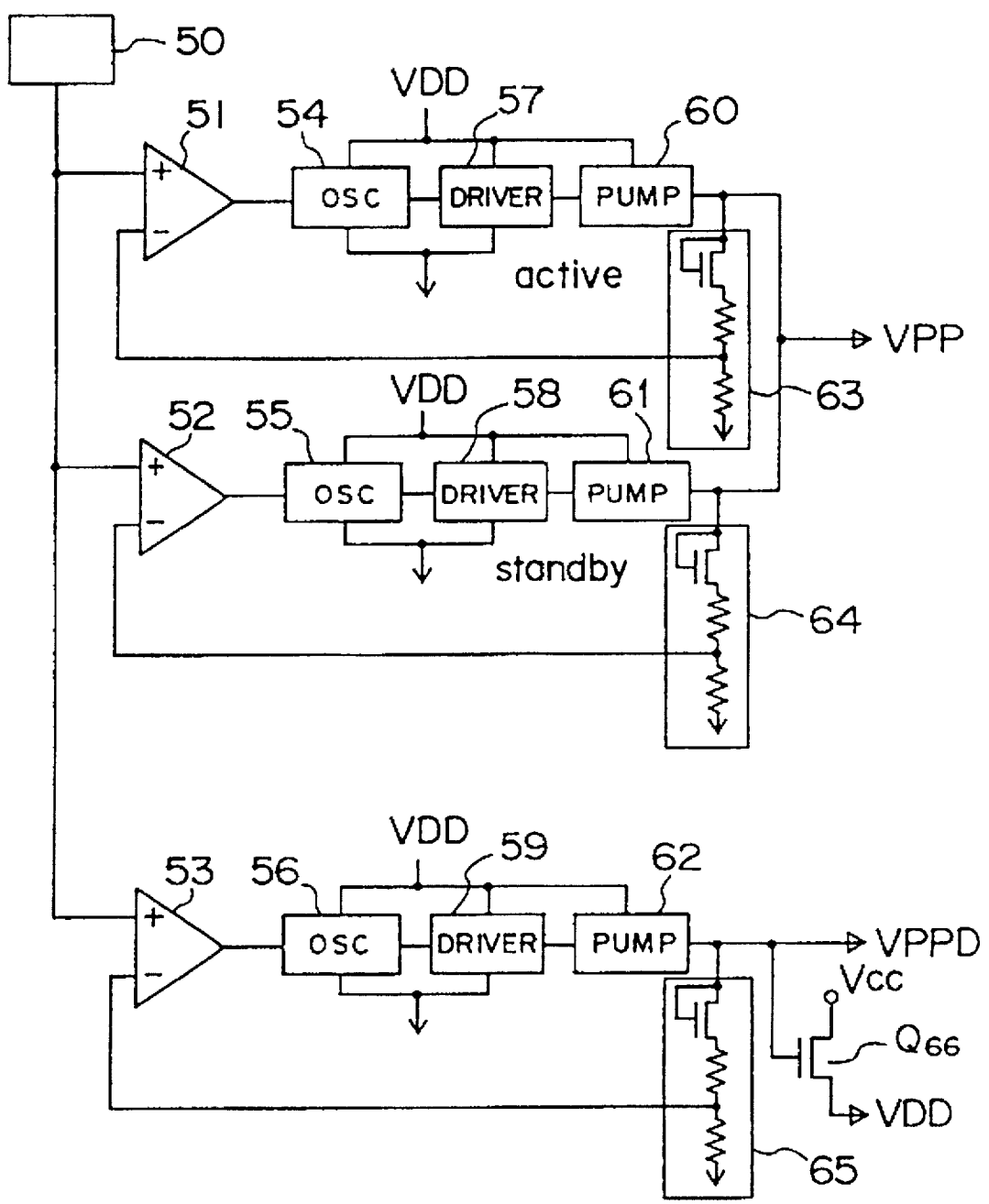
FIG. 10 is a structural view of a voltage boosting circuit in an embodiment of the present invention.

FIG. 10 shows the circuit structure of a power source system, which is composed of a reference voltage generating circuit 50, comparing circuits 51, 52 and 53, ring oscillator circuits 54, 55 and 56, driver circuits 57, 58 and 59, charge pump circuits 60, 61 and 62, voltage dividing circuits 63, 64 and 65, and a power source voltage drop transistor Q66. An external power source potential Vcc is dropped by the power source voltage drop transistor Q66, which is an N-channel MOS transistor, to generate the internal power source potential VDD. The power source voltage drop transistor Q66 is driven by VPPD, which is a potential boosted from VDD. The internal power source potential VDD is boosted by the charge pump circuits 60 and 61 to generate a boosted potential Vpp. In fact, the boosted potential Vpp is generated by two kinds of systems, a system exclusively for standby and a system for active operation. In this way, the power source system is composed of three voltage boosting systems, each of which performs its boosting operation independently with a feedback-type control.

Figure 11:
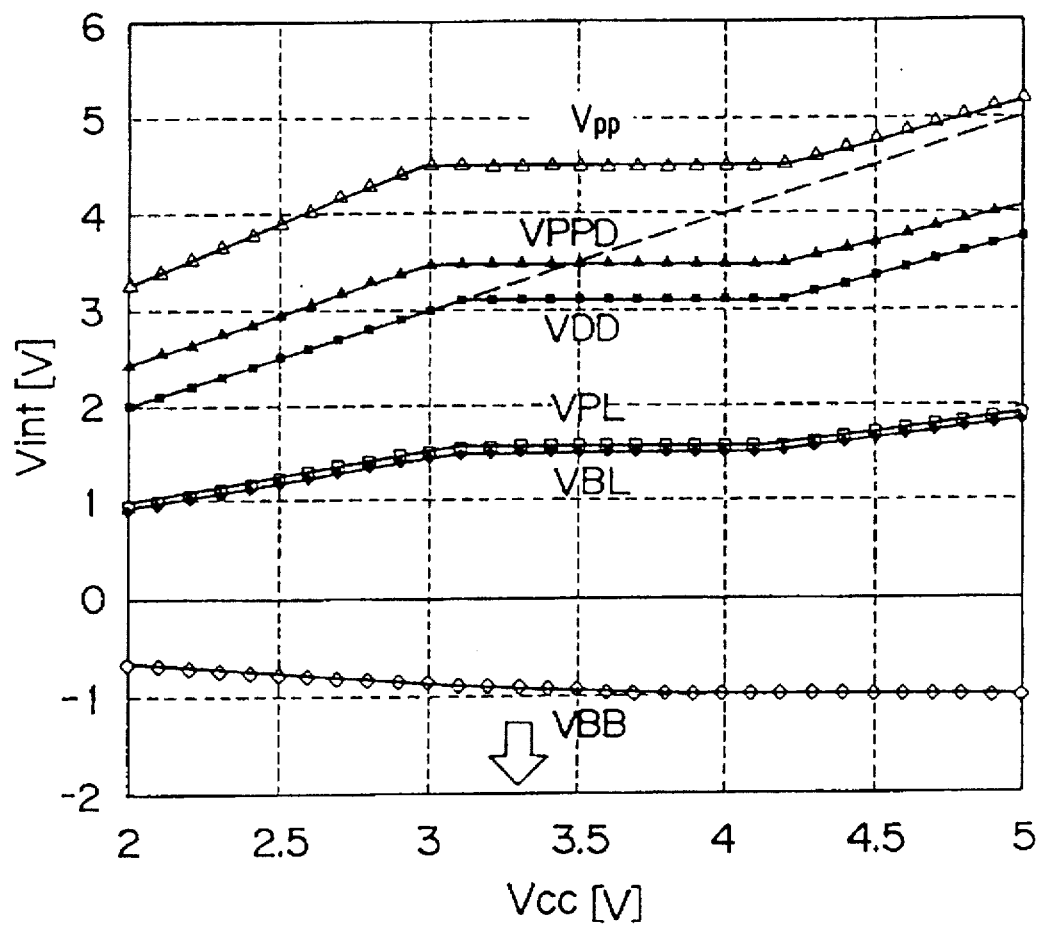
FIG. 11 is a diagram showing the operational characteristics of the voltage boosting circuit of FIG. 10.

FIG. 11 shows the behavior of the boosted potentials Vpp and VPPD, the internal power source potential VDD, a cell capacitor plate potential VPL, a bit line potential VBL, and a substrate potential VBB with respect to changes in the external power source potential Vcc. The former potentials are substantially constant in the region where the external power source potential Vcc is between approximately 3V and 4V.

Figure 12:
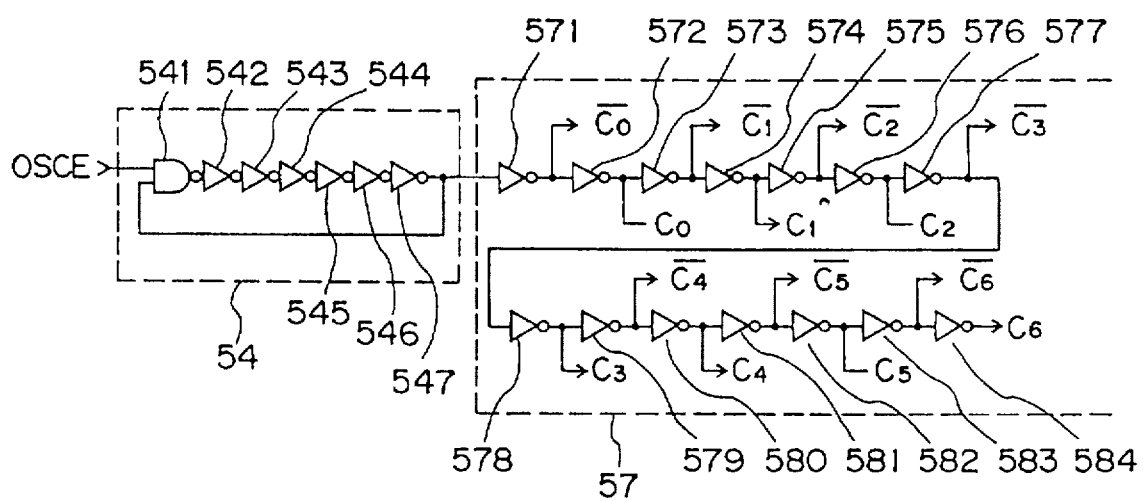
FIG. 12 is a circuit diagram showing in detail a portion of the voltage boosting circuit of FIG. 10.

FIG. 12 shows in detail the ring oscillator 54 and a portion of the driver circuit 57. In the ring oscillator 54, a NAND gate 541 and an even number of stages of inverter circuits 542, 543, 544, 545, 546 and 547 are connected in a ring-like configuration. In the driver circuit 57, inverter circuits 571, 572, 573, 574, 575, 576, 577, 578, 579, 580, 581, 582, 583 and 584 are connected in series and produce successively delayed output signals of /C0, C0, /C1, C1, /C2, C2, /C3, C3, /C4, C4, /C5, C5, /C6 and C6.

Figure 13:
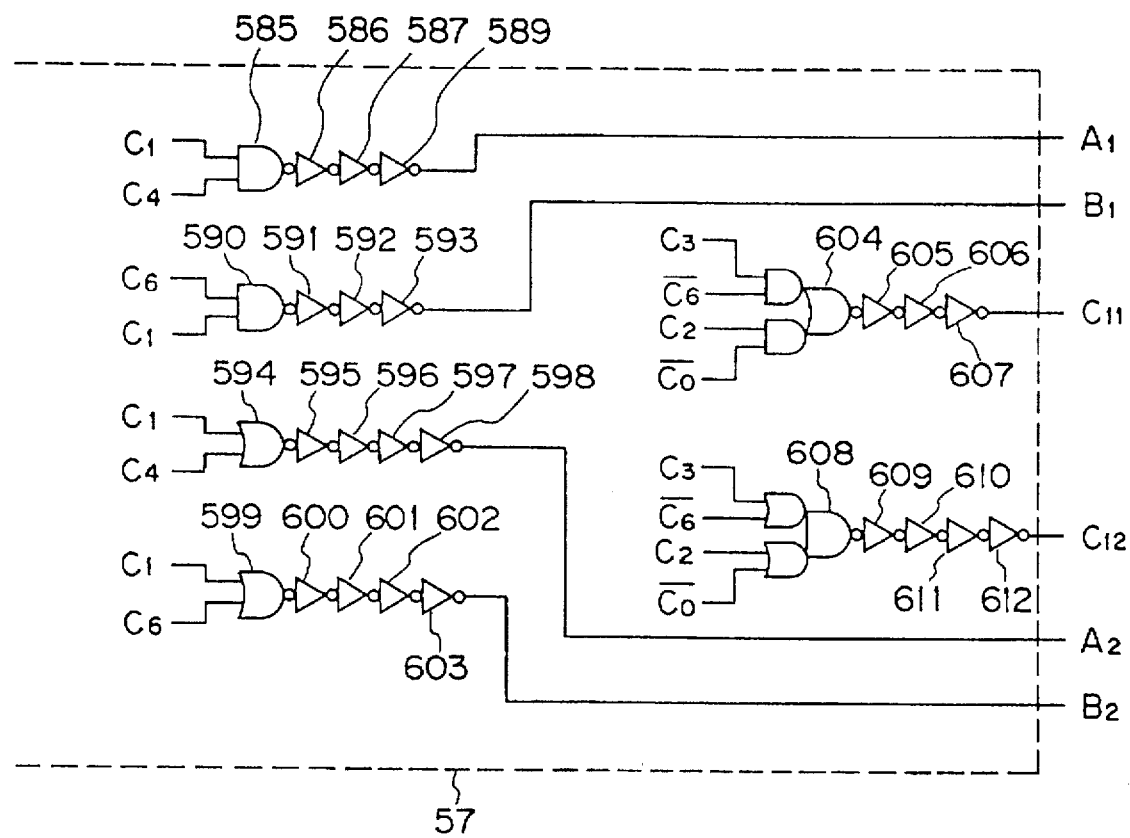
FIG. 13 is a circuit diagram showing in detail another portion of the voltage boosting circuit of FIG. 10.

FIG. 13 shows in detail the residual portion of the driver circuit 57. A signal A1 is formed from signals C1 and C4 by a NAND gate 585 and inverter circuits 586, 587 and 589. Another signal B1 is formed from signals C1 and C6 by a NAND gate 590 and inverter circuits 591, 592 and 593. Another signal C11 is formed from signals C3, /C6, C2, /C0 by an ANDNOR gate 604 and inverter circuits 605, 606 and 607. Another signal C12 is formed from signals C3, /C6, C2, /C0 by an ORNAND gate 608 and inverter circuits 609, 610, 611 and 612. Another signal A2 is formed from signals C1 and C4 by a NOR gate 594 and inverter circuits 595, 596, 597 and 598. Another signal B2 is formed from signals C1 and C6 by a NOR gate 599 and inverter circuits 600, 601, 602 and 603.

Figure 14:
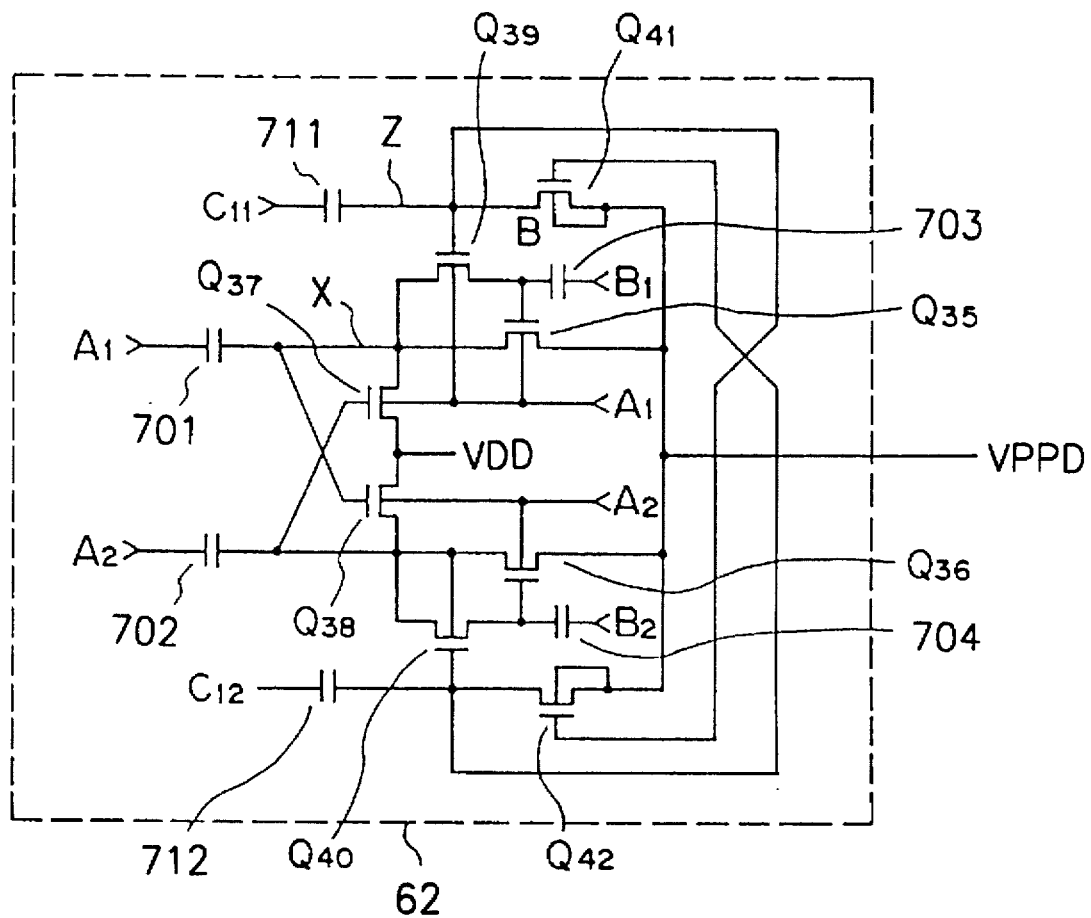
FIG. 14 is a circuit diagram showing in detail yet another portion of the voltage boosting circuit of FIG. 10.

FIG. 14 shows in detail the charge pump circuit 62. The charge pump circuit is composed of capacitors 701, 702, 703, 704, 711 and 712 and N-channel MOS transistors Q35, Q36, Q37, Q38, Q39, Q40, Q41 and Q42.

Figure 15:
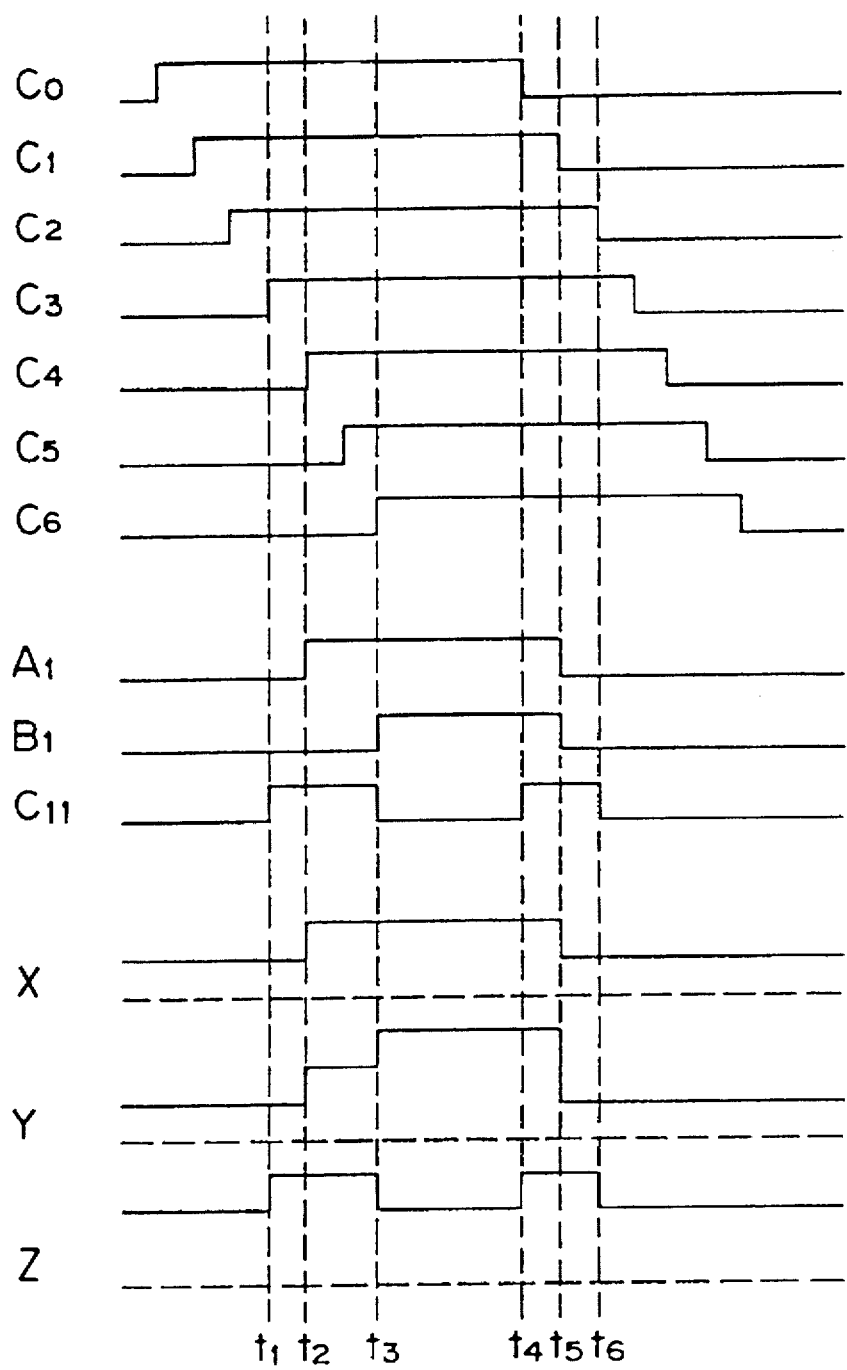
FIG. 15 is a diagram explaining the operation of the circuit shown in FIGS. 12, 13, and 14.

FIG. 15 shows the operation of the charge pump circuit 62 of FIG. 14, with reference to the ring oscillator circuit and driver circuit shown in FIGS. 12 and 13. Although the charge pump circuit is composed of symmetrical top and bottom circuits, the operation of only the top half portion will be explained for simplicity. To simplify the explanation even further, parasitic capacitance is not considered and the capacitor coupling ratio is assumed to be infinite. The driver circuit 57 provides the signals C0 through C6 with waveforms as shown in FIG. 15. In the initial state in which one cycle of operation has been completed, nodes X and Y are at VDD and node Z is at 2 VDD. When the signal C11 is changed from Vss to VDD at time t1, node Z is boosted from 2 VDD to 3 VDD by the capacitance connection of the capacitor 711. When the signal A1 rises from Vss to VDD at time t2, node X is boosted from VDD to 2 VDD by the capacitance connection of the capacitor 701. Additionally, 2 VDD is transmitted to node Y because 3 VDD is applied to the gate of the MOS transistor Q39. Next, when the signal B1 rises from Vss to VDD at time t3, node Y is boosted from 2 VDD to 3 VDD by the capacitance connection of the capacitor 703. At this moment, the MOS transistor Q39 is cut off. As a result, the MOS transistor Q35, to which 3 VDD is applied at the gate, becomes conductive and the 2 VDD at node X is transmitted to the VPPD node, which is the output node. Then, signal C11 rises again at time t4, signals A1 and B1 fall from VDD to Vss at time t5, and signal C11 falls at time t6. Even though the boosting and transmitting operations are already completed, signal C11 is set to VDD and node Z to 3 VDD from time t4 to time t6 so that node Y is firmly initialized to VDD.

Although the charge pump circuit is theoretically designed to output 2 VDD in a steady state manner as explained above, its actual output VPPD is approximately 3.5V when VDD is 3V due to a non-feedback control or parasitic capacitance. This circuit constitutes a very efficient charge pump compared with the conventional case. The explanation given for generating VPPD with charge pump circuit 62 is applicable to generating Vpp with charge pump circuits 60 and 61.

Figure 16:
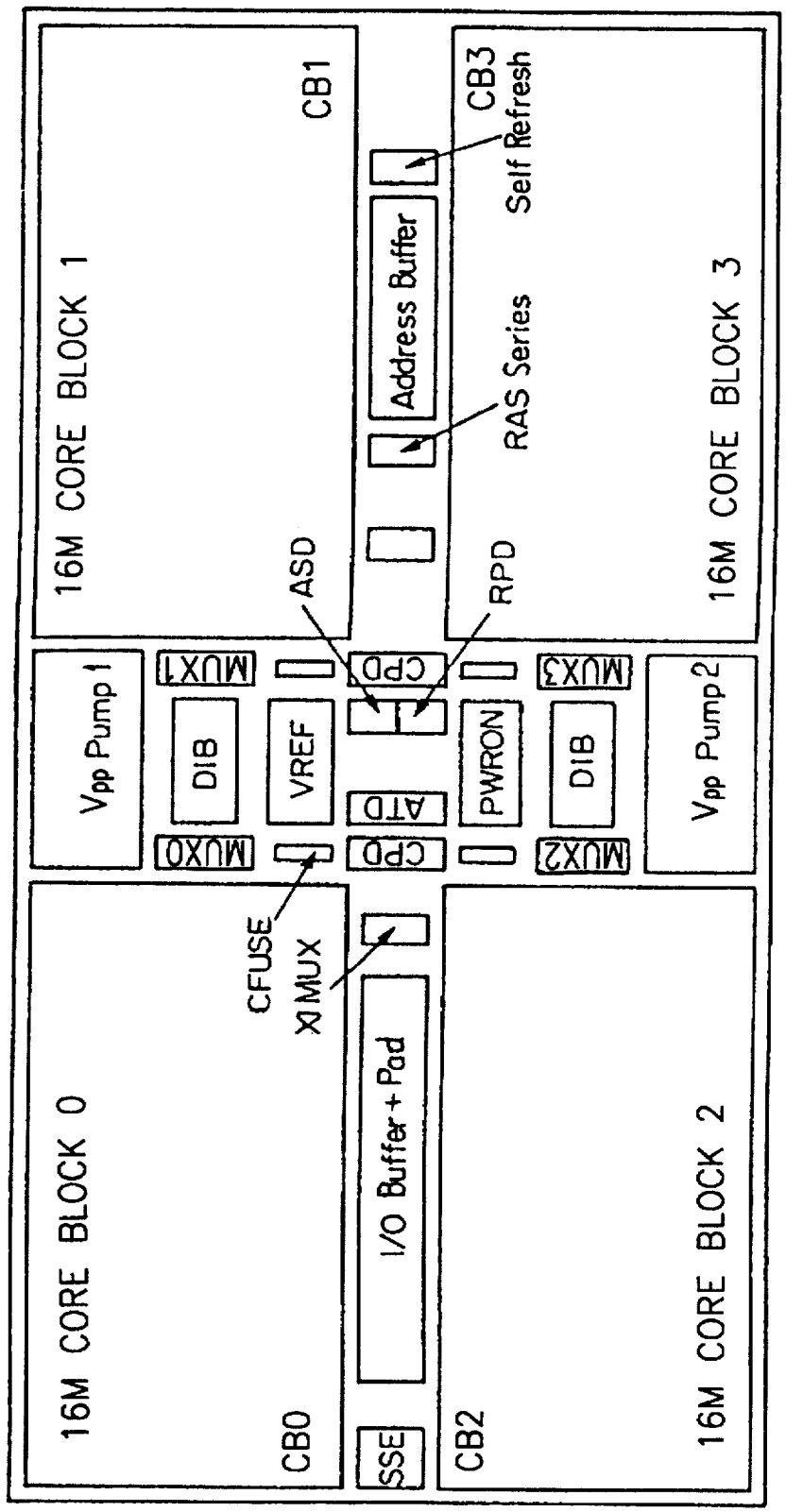
FIG. 16 is a plane view showing the complete structure of an embodiment of the present invention.

FIG. 16 shows an outline structural view of a DRAM of the present invention. The total memory capacity is assumed to be 64M bits. Core blocks CB0, CB1, CB2 and CB3 are arranged in a semiconductor chip 9. Each core block CB is composed of 16M bits of memory cells and their peripheral circuits, such as sense amplifiers, decoders and the like. Vpp generating circuits (Vpp Pump 1 and Vpp Pump 2), for generating a boosted voltage Vpp of a word line, are respectively arranged between CB0 and CB1, and CB2 and CB3. Data multiplexer circuits (MUX0 through MUX3) and data buffer circuits (DIB1 and DIB2) are arranged at data output units of the core blocks CB. A fuse array CFUSE, for holding replaced data of the column redundancy circuits, is located adjacent to each of the core blocks. A reference potential generating circuit VREF, for generating a reference or intermediate potential of ½ Vcc, is arranged between CB0 and CB1. A power-on reset circuit PWRON, for generating an initializing signal when the chip is initialized with the power source on, is arranged between CB2 and CB3. A substrate potential generating circuit SSB, a data input/output buffer (I/O Buffer and Pad), and an I/O data multiplexer circuit X1MUX, for selecting Pad in accordance with data output width, are successively arranged between CB0 and CB2. A self refresh control circuit (Self Refresh), an address buffer (Address Buffer), a row series control circuit (RAS Series), and a data control circuit DC are successively arranged between CB1 and CB3. Additionally, column partial decoder circuits CPD, an address transition detection circuit ATD, a row partial decoder circuit RPD, and a column address switch circuit ASD are arranged at the central portion of the chip 9.

FIGS. 17 through 20 are plane views illustrating arrangements of the external power source wiring Vcc, the internal power source wiring VDD, the ground wiring Vss, and the internal boosted voltage power source wiring Vpp in an embodiment of the present invention. In these figures, "um" designates a width of wiring in μm units. The bold lines designate metal wirings in a second metal layer and the other lines designate metal wirings in a first metal layer.

Figure 17:
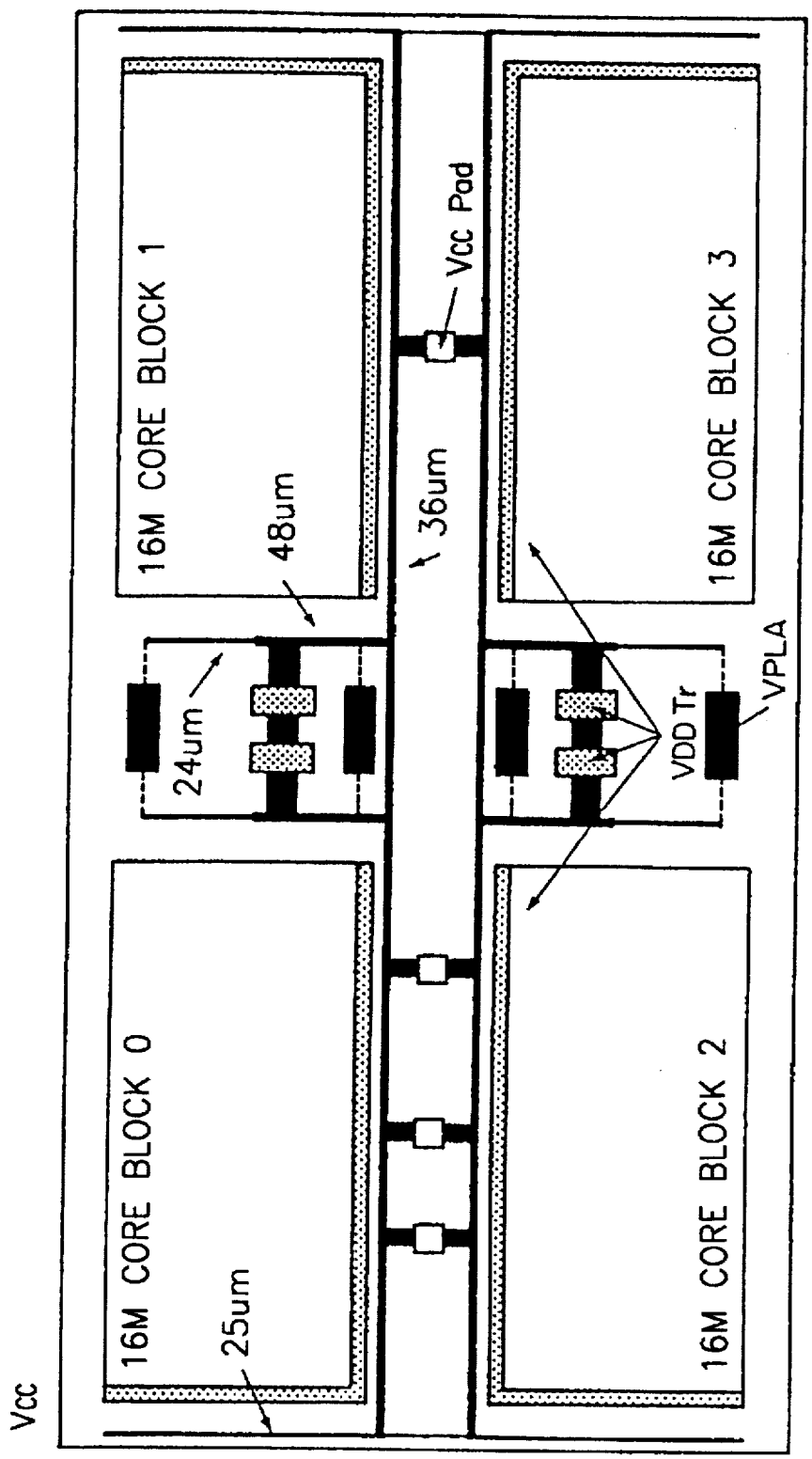
FIG. 17 is a plane view showing the pattern of the external power source potential supply wiring (Vcc) in an embodiment of the present invention.

FIG. 17 is a plane view showing the arrangement of the external power source supply wiring (Vcc) in an embodiment of the present invention. In FIG. 17, "VDD Tr" designates a transistor for generating the internal power source potential VDD from the external power source potential Vcc. Four such transistors (VDD Tr) are arranged in a region between the left and right core blocks and corresponding transistors are arranged in an L-shape along two sides of each of the core blocks. These transistors are important features of the present invention. Charge pumps VPLA of the Vpp voltage boosting circuit are also provided in the region between the left and right core blocks.

Figure 18:
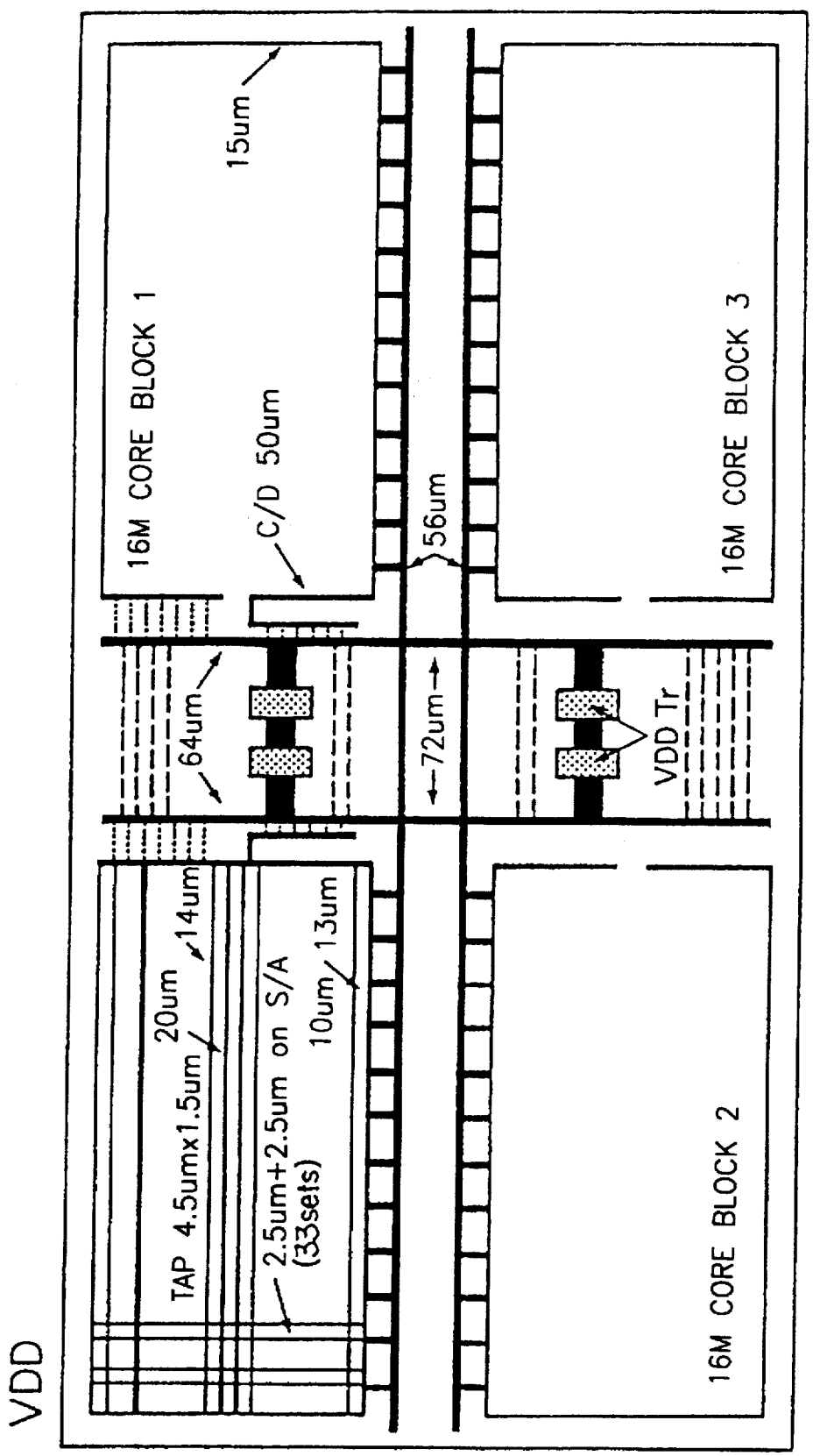
FIG. 18 is a plane view showing the pattern of the internal power source potential supply wiring (VDD) in an embodiment of the present invention.
Figure 19:
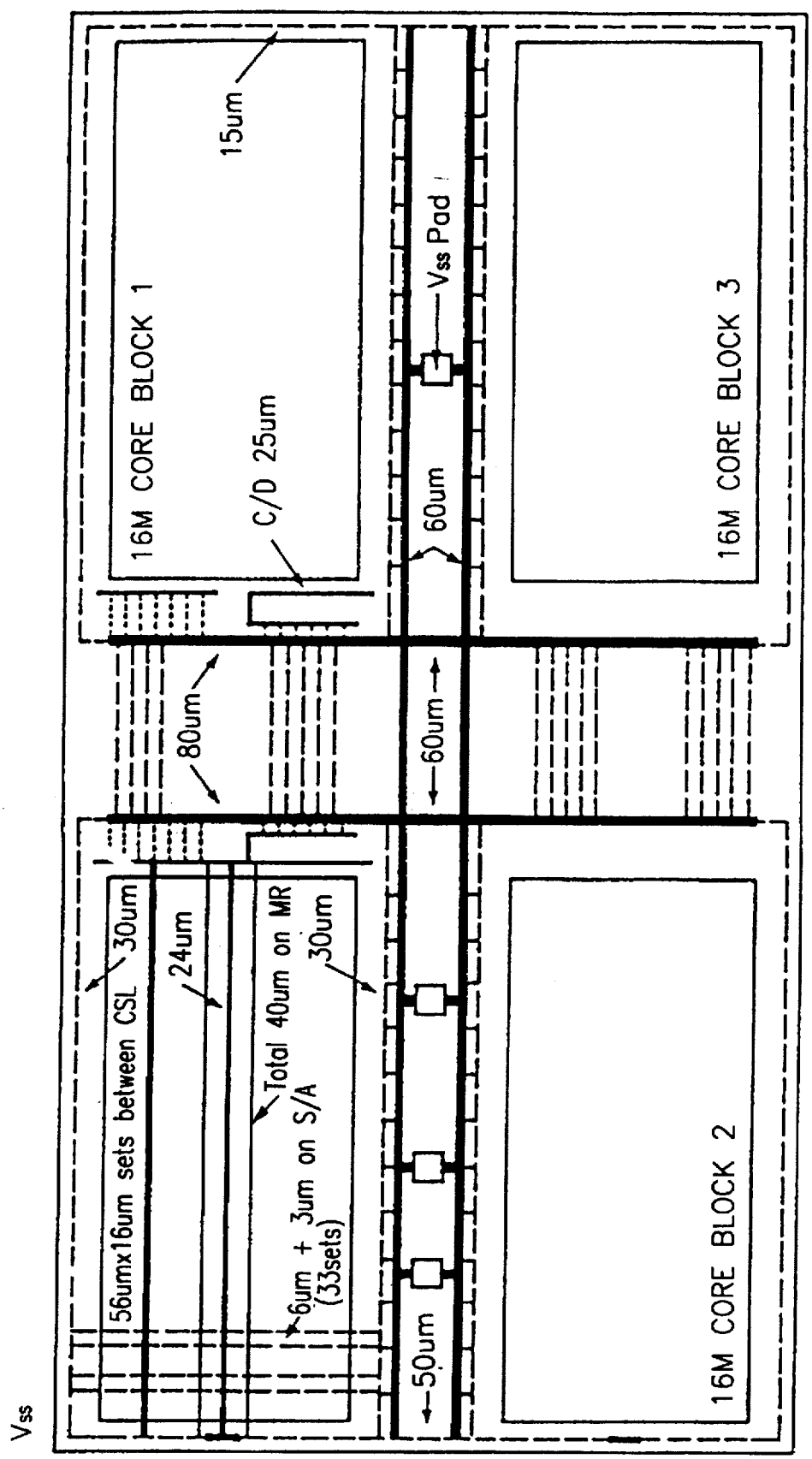
FIG. 19 is a plane view showing the pattern of the ground potential supply wiring (Vss) in an embodiment of the present invention.
Figure 20:
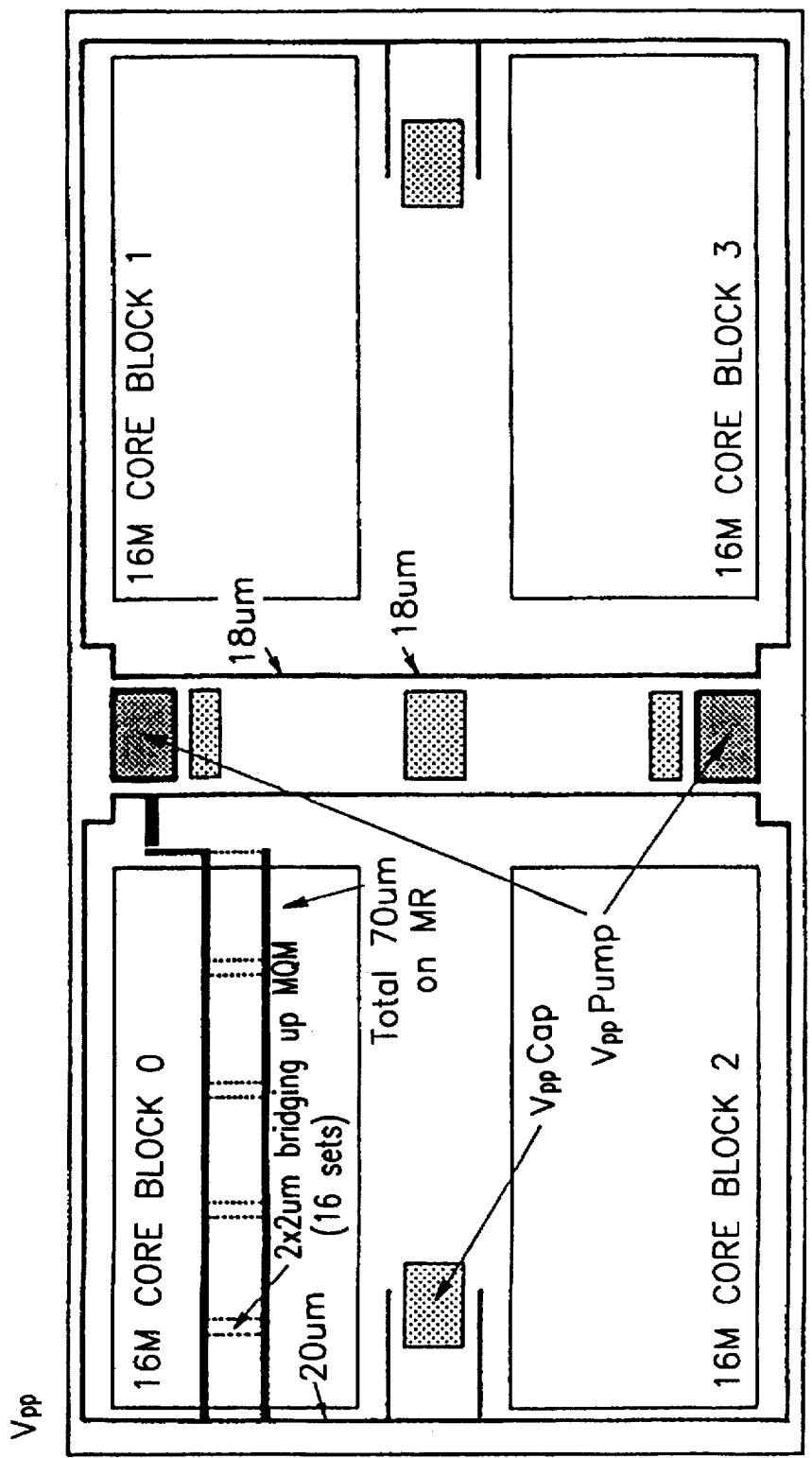
FIG. 20 is a plane view showing the pattern of the boosted potential supply wiring (Vpp) in an embodiment of the present invention.

As shown in FIGS. 18 and 19, the internal power source wirings VDD and the ground wirings Vss are arranged above the core blocks in a mesh-like shape to supply power and ground to the sense amplifier drive circuits, decoder circuits and the like in the core blocks. Further, as shown in FIG. 20, the internal boosted voltage power source wirings Vpp are connected to stabilizing capacitance elements (Vpp CAP) after detouring outer peripheral portions of the core blocks to avoid bus wirings on both sides of the pad arrays. Some of the stabilizing capacitance elements are arranged between the core blocks CB0 and CB2, and the core blocks CB1 and CB3.

The above embodiment of the present invention makes possible the easy arrangement of wirings for power source lines, signal lines, and the like. This is very preferable in a large capacity DRAM. Furthermore, this embodiment can achieve acceleration in operating speed, a reduction in chip area, and high reliability through the reduction of noise, which is particularly preferable in a DRAM driven by a low voltage power source.

Figure 21:
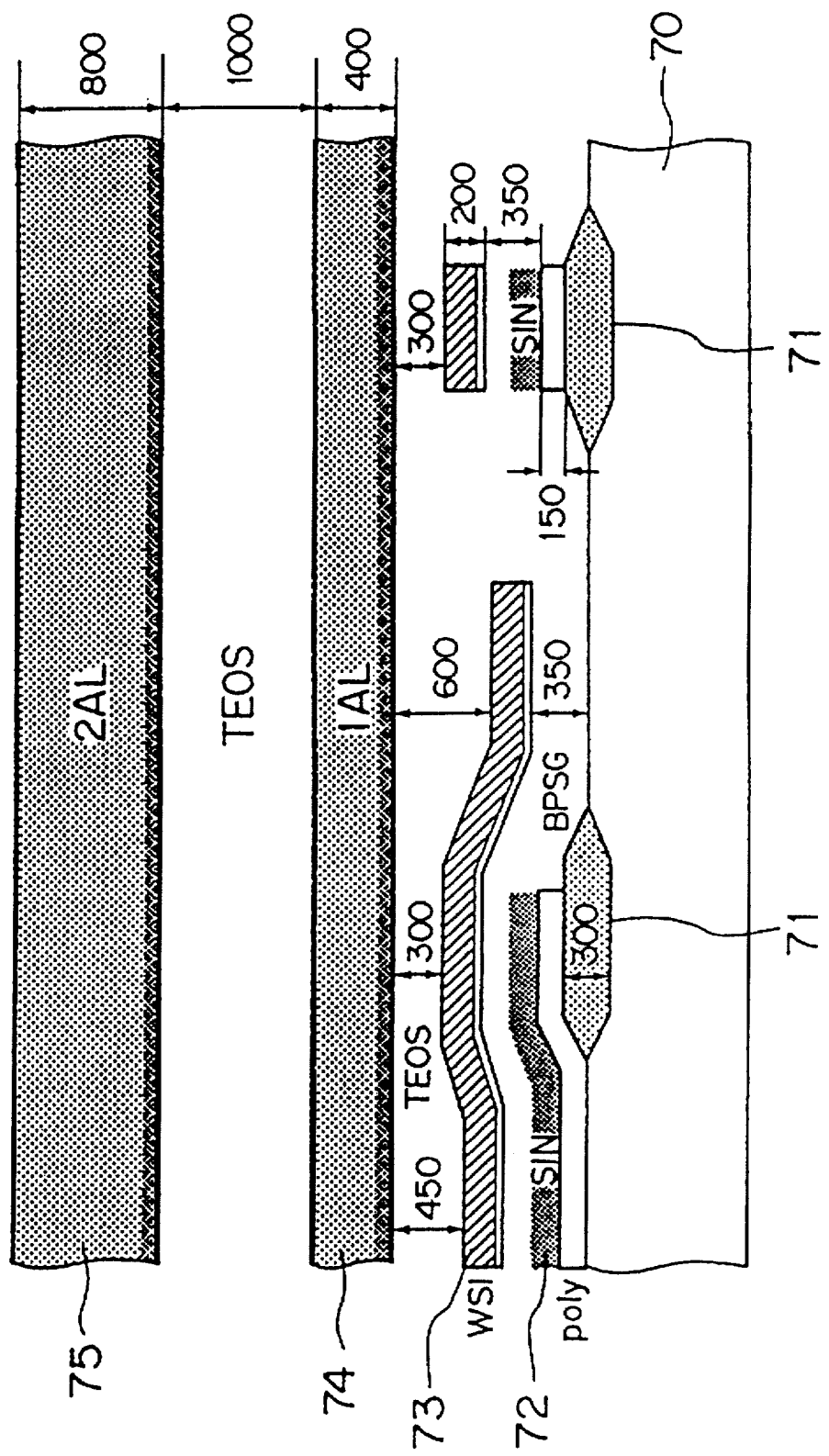
FIG. 21 is a sectional view of an embodiment of the present invention.

FIG. 21 shows a sectional view of a wiring region in a semiconductor memory that is an embodiment of the present invention. Insulative films 71 for separating elements are formed on a silicon substrate 70. The insulative films 71 are composed of oxide films approximately 300 nm (in thickness) that are formed beneath a first layer of polysilicon wiring 72. The polysilicon wiring 72 is illustratively composed of a 150 nm layer of polysilicon doped with N-type impurities laminated with a nitride film having a predetermined thickness. A BPSG layer, which is illustratively 350 nm thick in combination with the nitride film, is formed on the first layer of polysilicon wiring. Then, a second layer of polysilicon wiring 73, which is made, for example, of a 200 nm layer of tungsten silicide, is formed on the BPSG layer. A TEOS oxide film of least 300 nm is then formed on the second layer of polysilicon wiring 73. Next, a first layer of metal wiring 74, illustratively composed of a 400 nm layer of aluminum, is formed on the TEOS oxide film. Finally, on top of another TEOS oxide film of 1000 nm, there is formed a second layer of metal wiring 75, composed of, for example, an 800 nm layer of aluminum.

With respect to wirings of equal width, the resistance per unit length in the second metal wiring layer is far smaller than that in the first metal wiring layer. By adopting the wiring structure of the present invention as shown in FIGS. 2 and 3, almost all of the essential portions of the bus wiring and the power source wiring can use the low resistance wiring in the second layer. This is very preferable in a high-speed DRAM. Specifically, the first layer of metal wiring 74 is used for the row direction power source wirings PSLC, the row direction ground potential wirings, and the column select line wirings CSL. The second layer of metal wiring 75 is used for the column direction power source wirings PSLR, the column direction ground potential wirings PSLC, and for bypass line wirings for making the word lines have a low resistance.

In this way, it is possible to use two layers of metal wiring to form four kinds of wirings groups (the power source wiring group, the ground wiring group, the column select line wiring group, and the bypass line wiring group for the word lines) in a mesh-like form. Most importantly, the power source wiring group and the ground wiring group can form their planar wirings by using the first and second metal wiring layers. For example, a planar wiring is formed by threading the power source wirings through the column select line wirings, the bypass line wirings for word lines, and the like, and rendering the power source wirings in contact with each other at intersections of the first and second metal wiring layers.

Although a detailed explanation has been given of embodiments of the present invention with respect to a 64M bit DRAM, the present invention is not limited to the above-mentioned embodiments and various modifications may naturally be performed without deviating from the gist of the present invention.

As previously explained, the present invention provides a semiconductor memory having a power source circuit and power source wirings capable of supplying sufficient power to respective members in a core block, achieves promotion of yield, and contributes to a reduction in chip area.

What is claimed is:

1. A semiconductor memory comprising:
   a core block, the core block including:
   at least one memory cell array, each memory cell array having memory cells arranged in a matrix;
   a plurality of sense amplifier arrays, each sense amplifier array having sense amplifiers arranged in a column; and
   a plurality of first sense amplifier drive circuits, each first sense amplifier drive circuit adjacent to one of the sense amplifier arrays,
   wherein the sense amplifier arrays are arranged alternately with the memory cell arrays;
   a power source circuit for supplying power to the plurality of first sense amplifier drive circuits, the power source circuit being arranged in an L-shape along a first long side and a first short side of the core block; and
   a group of power source wirings for connecting the power source circuit to the plurality of first sense amplifier drive circuits, the group of power source wirings being arranged in a mesh-like configuration above the core block.

2. The semiconductor memory according to claim 1, wherein the group of power source wirings comprises a plurality of first power source wirings arranged in a row direction and a plurality of second power source wirings arranged in a column direction, wherein the first power source wirings and the second power source wirings intersect and are connected together at points of intersection.

3. The semiconductor memory according to claim 2, wherein the core block further comprises:
   at least one decode circuit; and
   at least one plurality of select lines, each plurality of select lines being connected to one decode circuit,
   wherein each plurality of select lines is arranged in parallel with the plurality of second power source wirings and constructed in the same wiring layer as the plurality of second power source wirings.

4. The semiconductor memory according to claim 3, wherein the second power source wirings are arranged between of select lines.

5. The semiconductor memory according to claim 2, wherein the core block further comprises:
   a plurality of word lines; and
   a plurality of bypass line wirings for lowering the resistance of the word lines,
   wherein the plurality of bypass line wirings is arranged in parallel with the plurality of first power source wirings and constructed in the same wiring layer as the plurality of first power source wirings.

6. The semiconductor memory according to claim 5, wherein the first power source wirings are arranged between the plurality of bypass line wirings.

7. The semiconductor memory according to claim 1, wherein the first sense amplifier drive circuits are arranged along the first long side and a second long side opposing the first long side of the core block.

8. The semiconductor memory according to claim 1, wherein the core block further comprises:
   a plurality of second sense amplifier drive circuits, each second sense amplifier drive circuit corresponding to one of the sense amplifier arrays; and
   a group of ground wirings connected to the plurality of second sense amplifier drive circuits, the group of ground wirings being arranged in a mesh-like form above the core block.

9. The semiconductor memory according to claim 8, wherein the group of power source wirings comprises a plurality of first power source wirings arranged in a row direction and a plurality of second power source wirings arranged in a column direction, wherein the first power source wirings and the second power source wirings intersect and are connected together at points of intersection;
   the group of ground wirings comprises a plurality of first ground wirings arranged in a row direction and a plurality of second ground wirings arranged in a column direction, wherein the first ground wirings and the second ground wirings intersect and are connected together at points of intersection; and
   the plurality of first power source wirings are constructed in the same wiring layer as the plurality of first ground wirings, and the plurality of second power source wirings are constructed in the same wiring layer as the plurality of second ground wirings.

10. The semiconductor memory according to claim 9, wherein the core block further comprises:
    at least one decode circuit; and
    at least one plurality of select lines, each plurality of select lines being connected to one decode circuit,
    wherein each plurality of select lines is arranged in parallel with the plurality of second power source wirings and constructed in the same wiring layer as the plurality of second power source wirings.

11. The semiconductor memory according to claim 10, wherein the core block further comprises:
    a plurality of word lines; and
    a plurality of bypass line wirings for lowering the resistance of the word lines,
    wherein the plurality of bypass line wirings is arranged in parallel with the plurality of first power source wirings and constructed in the same wiring layer as the plurality of first power source wirings.

12. The semiconductor memory according to claim 1, wherein the power source circuit comprises a plurality of MOS transistors, wherein a first electrode of each MOS transistor is connected to an external power source terminal a second electrode of each MOS transistor is connected to the group of power source wirings, and a gate electrode of each MOS transistor is connected to a reference potential for controlling the MOS transistor.

13. The semiconductor memory according to claim 12, further comprising a reference potential generating circuit for generating the reference potential from a power source potential, wherein the power source potential is supplied by the second electrode of each MOS transistor.

14. The semiconductor memory according to claim 13, wherein the reference potential generating circuit generates the reference potential by boosting the power source potential.

15. The semiconductor memory according to claim 1, wherein the power source circuit supplies power to other circuits within the core block in addition to the plurality of first sense amplifier drive circuits.

16. The semiconductor memory according to claim 1, wherein the power source circuit is further arranged along a second long side opposing the first long side of the core block and a second short side opposing the first short side of the core block to surround the core block.

17. The semiconductor memory according to claim 16, wherein the group of power source wirings comprises a plurality of first power source wirings arranged in a row direction and a plurality of second power source wirings arranged in a column direction, wherein the first power source wirings and the second power source wirings intersect and are connected together at points of intersection.

18. The semiconductor memory according to claim 17, wherein the core block further comprises:

at least one decode circuit; and at least one plurality of select lines, each plurality of select lines being connected to one decode circuit, wherein each plurality of select lines is arranged in parallel with the plurality of second power source wirings and constructed in the same wiring layer as the plurality of second power source wirings.

19. The semiconductor memory according to claim 18, wherein the second power source wirings are arranged between the select lines.

20. The semiconductor memory according to claim 16, wherein the power source circuit comprises a plurality of MOS transistors, wherein a first electrode of each MOS transistor is connected to an external power source terminal, a second electrode of each MOS transistor is connected to the group of power source wirings, and a gate electrode of each MOS transistor is connected to a reference potential for controlling the MOS transistor.

21. The semiconductor memory according to claim 20, further comprising a reference potential generating circuit for generating the reference potential from a power source potential, wherein the power source potential is supplied by the second electrode of each MOS transistor.

22. The semiconductor memory according to claim 21, wherein the reference potential generating circuit generates the reference potential by boosting the power source potential.

23. The semiconductor memory according to claim 16, wherein the power source circuit supplies power to other circuits within the core block in addition to the plurality of first sense amplifier drive circuits.

24. A semiconductor memory comprising:

a core block, the core block including:

at least one memory cell array, each memory cell array having memory cells arranged in a matrix;

a plurality of sense amplifier arrays, each sense amplifier array having sense amplifiers arranged in a column; and a plurality of sense amplifier drive circuits for driving N-channel MOS transistors in the sense amplifiers, each sense amplifier drive circuit corresponding to one of the sense amplifier arrays and including a plurality of driving transistors that are arranged throughout the corresponding sense amplifier array, wherein the sense amplifier arrays are arranged alternately with the memory cell arrays; and a group of ground wirings for connecting the plurality of sense amplifier drive circuits to a ground potential, the group of ground wirings being arranged in a mesh-like configuration above the core block.

25. The semiconductor memory according to claim 24, wherein the group of ground wirings comprises a plurality of first ground wirings arranged in a row direction and a plurality of second ground wirings arranged in a column direction, wherein the first ground wirings and the second ground wirings intersect and are connected together at points of intersection.

26. The semiconductor memory according to claim 25, wherein the core block further comprises:

at least one decode circuit; and at least one plurality of select lines, each plurality of select lines being connected to one decode circuit, wherein each plurality of select lines is arranged in parallel with the plurality of second ground wirings and constructed in the same wiring layer as the plurality of second ground wirings.

27. The semiconductor memory according to claim 26, wherein the second ground wirings are arranged between the select lines.

28. The semiconductor memory according to claim 25, wherein the core block further comprises:

a plurality of word lines; and a plurality of bypass line wirings for lowering the resistance of the word lines, wherein the plurality of bypass line wirings is arranged in parallel with the plurality of first ground wirings and constructed in the same wiring layer as the plurality of first ground wirings.

29. The semiconductor memory according to claim 28, wherein the first ground wirings are arranged between the plurality of bypass line wirings.

30. The semiconductor memory according to claim 24, wherein the group of ground wirings connect the ground potential to other circuits within the core block in addition to the plurality of sense amplifier drive circuits.

* * * * *